United States Patent
Lei et al.

(10) Patent No.: US 9,543,517 B2
(45) Date of Patent: *Jan. 10, 2017

(54) METHOD OF MAKING A MULTICOMPONENT FILM

(71) Applicant: AIR PRODUCTS AND CHEMICALS, INC., Allentown, PA (US)

(72) Inventors: Xinjian Lei, Vista, CA (US); Moo-Sung Kim, Gyunggi-do (KR)

(73) Assignee: AIR PRODUCTS AND CHEMICALS, INC., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/940,340

(22) Filed: Nov. 13, 2015

(65) Prior Publication Data
US 2016/0087207 A1    Mar. 24, 2016

Related U.S. Application Data

(63) Continuation of application No. 14/245,403, filed on Apr. 4, 2014, now Pat. No. 9,214,630.
(Continued)

(51) Int. Cl.
*H01L 21/302* (2006.01)
*H01L 21/461* (2006.01)
(Continued)

(52) U.S. Cl.
CPC ........... *H01L 45/1616* (2013.01); *C23C 16/22* (2013.01); *C23C 16/28* (2013.01); *C23C 16/305* (2013.01);
(Continued)

(58) Field of Classification Search
CPC ........... H01L 21/1203; H01L 21/02252; H01L 21/3141; H01L 21/28294; H01L 45/144; H01L 45/1616; C23C 16/305; C23C 16/456; C23C 16/277; C23C 16/45525
(Continued)

(56) References Cited

U.S. PATENT DOCUMENTS 7,041,170 B2    5/2006    Fitzgerald et al.
7,045,451 B2    5/2006    Shenai-Khatkhate et al.
(Continued)

FOREIGN PATENT DOCUMENTS

CN    101232047    7/2008
EP    2083096    7/2009
(Continued)

OTHER PUBLICATIONS

R. Schwarz, et al, Uber das Germaniummonochlorid und das Digermaniumhexachlorid2, Z. Anorg. Allg. Chem, 275, 1-20, 1954.
(Continued)

*Primary Examiner* — David Nhu
(74) *Attorney, Agent, or Firm* — Lina Yang (57) ABSTRACT

Described herein is a method and precursor composition for depositing a multicomponent film. In one embodiment, the method and composition described herein is used to deposit a germanium-containing film such as Germanium Tellurium, Antimony Germanium, and Germanium Antimony Tellurium (GST) films via an atomic layer deposition (ALD) and/or other germanium, tellurium and selenium based metal compounds for phase change memory and photovoltaic devices. In this or other embodiments, the Ge precursor used trichlorogermane.

4 Claims, 5 Drawing Sheets

Related U.S. Application Data (60) Provisional application No. 61/810,919, filed on Apr. 11, 2013.

(51) Int. Cl.

| | | |
|---|---|---|
| *H01L 45/00* | (2006.01) | |
| *C23C 16/22* | (2006.01) | |
| *C23C 16/28* | (2006.01) | |
| *C23C 16/30* | (2006.01) | |
| *C23C 16/455* | (2006.01) | |

(52) U.S. Cl.
CPC ... *C23C 16/45525* (2013.01); *C23C 16/45531* (2013.01); *C23C 16/45553* (2013.01); *H01L 45/06* (2013.01); *H01L 45/144* (2013.01)

(58) Field of Classification Search
USPC ....... 438/769, 752, 478, 763, 507, 602, 622; 257/E21.006, E21.007, E21.085, E21.092, 257/E21.126, E21.127, E21.311, E21.319, 257/E21.32
See application file for complete search history.

(56) References Cited

U.S. PATENT DOCUMENTS

| | | | |
|---|---|---|---|
| 7,141,488 B2 | 11/2006 | Woelk et al. | |
| 7,413,776 B2 * | 8/2008 | Shenai-Khatkhate | C07C 391/00 |
| | | | 427/255.28 |
| 7,767,840 B2 | 8/2010 | Shenai-Khatkhate et al. | |
| 8,691,668 B2 | 4/2014 | Gatineau et al. | |
| 8,877,549 B2 | 11/2014 | Roeder et al. | |
| 9,214,630 B2 * | 12/2015 | Xiao | H01L 45/1616 |
| 2003/0045075 A1 | 3/2003 | Joo et al. | |
| 2003/0230233 A1 | 12/2003 | Fitzgerald et al. | |
| 2004/0259333 A1 | 12/2004 | Tomasini et al. | |
| 2008/0017841 A1 | 1/2008 | Lee et al. | |
| 2009/0074652 A1 | 3/2009 | Dussarrat | |
| 2009/0112009 A1 | 4/2009 | Chen et al. | |
| 2009/0142881 A1 | 6/2009 | Xiao et al. | |
| 2009/0162973 A1 | 6/2009 | Gatineau et al. | |
| 2009/0280052 A1 | 11/2009 | Xiao et al. | |
| 2009/0324821 A1 | 12/2009 | Pore et al. | |
| 2010/0009078 A1 | 1/2010 | Pore et al. | |
| 2012/0034767 A1 | 2/2012 | Xiao et al. | |
| 2012/0115315 A1 | 5/2012 | Zheng | |
| 2013/0230975 A1 | 9/2013 | Kakimoto et al. | |
| 2014/0162401 A1 | 6/2014 | Kawano et al. | |

FOREIGN PATENT DOCUMENTS

| | | |
|---|---|---|
| JP | S61-234030 | 10/1986 |
| JP | S61-281870 | 12/1986 |
| JP | S61-283111 | 12/1986 |
| JP | 2006523380 | 10/2006 |
| JP | 2009274949 | 11/2009 |
| TW | 200822356 | 5/2008 |
| TW | 201247589 | 12/2012 |
| WO | 02065508 | 8/2002 |
| WO | 2004086473 | 10/2004 |
| WO | 2007133837 | 11/2007 |
| WO | 2008057616 | 5/2008 |
| WO | 2009081383 | 7/2009 |
| WO | 2013027682 | 2/2013 |

OTHER PUBLICATIONS

G. Bauer, "12. Silicon and Germanium", Handbook of Preparative Inorganic Chemisty, 717, Academic, 1963.
A. Meller, et al, "Synthese und Isolierung neuer Germanium(II)-Verbindungen und freier Germylene", Chem. Ber., 118, 1985, 2020-2029.
V.I. Kulishov, et al, "Crystal Structure of the Germanium Dichloride Complex with 1,4-Dioxane", Journal of Structural Chemistry, 11(1), 61-64.
H. Basch, "Bond dissociation energies in organometallic compounds", Inorganica Chimica Acta, 252, 1996, 265-279.
J. Lee, GeSbTe deposition for the PRAM application, Applied Surface Science 253, 2007, 3969-3976.

* cited by examiner

METHOD OF MAKING A MULTICOMPONENT FILM

CROSS REFERENCE TO RELATED APPLICATIONS

This application is a continuation application of U.S. patent application Ser. No. 14/245,403, U.S. Pat. No. 9,214,630; filed on Jul. 21, 2015, which claimed the priority benefit of U.S. Patent Application Ser. No. 61/810,919, filed on Apr. 11, 2013.

BACKGROUND OF THE INVENTION

Disclosed herein is a method for depositing multicomponent films each of which may be stoichiometric or non-stoichiometric such as, but not limited to, Germanium Tellurium (GT), Antimony Germanium (SG), Germanium Antimony Tellurium (GST), Germanium Oxide, Germanium Nitride. Precursor compositions or mixtures thereof for depositing the multicomponent film using the method described herein are also contemplated.

Certain alloys such as but not limited to, GST (Germanium Antimony Tellurium alloy), and GeTe (Germanium Tellurium alloy) are used to fabricate electronic devices, including Phase Change Random Access Memory (PCRAM). Phase-change materials exist in a crystalline state or an amorphous state according to temperature. A phase-change material has a more ordered atomic arrangement and a lower electrical resistance in a crystalline state than in an amorphous state. A phase-change material can be reversibly transformed from the crystalline state to the amorphous state based on an operating temperature. Such characteristics, that is, reversible phase change and different resistances of different states, are applied to newly proposed electronic devices, a new type of nonvolatile memory devices, phase-change random access memory (PCRAM) devices. The electrical resistance of a PCRAM may vary based on a state (e.g., crystalline, amorphous, etc.) of a phase-change material included therein.

Among various types of phase-change materials used for memory devices, the most commonly used are ternary chalcogenides of Group 14 and Group 15 elements, such as Germanium Antimony Tellurium compounds of various compositions, including but not limited to $Ge_2Sb_2Te_5$, and commonly abbreviated as GST. The solid phases of GST can rapidly change from crystalline state to amorphous state or vise versa upon heating and cooling cycles. The amorphous GST has relatively higher electrical resistance while the crystalline GST has relatively lower electrical resistance.

For the fabrication of phase change random access memory (PCRAM) with a design requirement less than 20 nanometers (nm), the demand for good precursors for GeSbTe atomic layer deposition (ALD) has been increasing since ALD is the most suitable deposition method for excellent step coverage, accurate thickness and film composition controls. The most widely investigated compositions of GST lie on the GeTe—$Sb_2Te_3$ pseudo-binary tie line. However, ALD deposition of these compositions is difficult because of the greater stability of $Ge^{+4}$ precursors than $Ge^{+2}$ precursors and $Ge^{+4}$ tends to form $GeTe_2$ instead of GeTe. Under these circumstances $GeTe_2$—$Sb_2Te_3$ composition films would be formed. Therefore, there is a need for precursors and related manufacturing methods or processes for forming GT and GST films which can produce films with high conformality and chemical composition uniformity, particularly using an ALD deposition process.

BRIEF SUMMARY OF THE INVENTION

Described herein are methods, precursors and mixtures thereof for depositing germanium-containing films. In this connection, trichlorogermane ($HGeCl_3$) can easily dissociate into HCl and $GeCl_2$ at relatively low temperature. This property makes $HGeCl_3$ a suitable precursor which can generate divalent germanium species in situ in the deposition process. In one particular embodiment, $HGeCl_3$, when used in a deposition process with other precursors $(Me_3Si)_2Te$ and $(EtO)_3Sb$, may increase the germanium composition in GST alloy, comparing with commonly used Ge precursors such as $(MeO)_4Ge$. The use of $HGeCl_3$ as an germanium precursor allows one to solve the aforementioned problems of other previous germanium precursor and achieve the desired $Ge_2Sb_2Te_5$ composition in certain embodiments.

One embodiment of the method for depositing a multicomponent film onto at least a portion of a substrate comprises the steps of:
  a) contacting the substrate with a Ge precursor comprising $HGeCl_3$ to react with the substrate and provide a first coating layer comprising Ge;
  b) introducing a purge gas to remove any unreacted Ge precursor;
  c) contacting the first coating layer comprising Ge with a Te precursor, wherein at least a portion of the Te precursor reacts with the Ge comprised therein to provide a second coating layer comprising Ge and Te;
  d) introducing a purge gas to remove any unreacted Te precursor;
  e) contacting the second coating layer comprising Ge and Te with a Sb precursor, wherein at least a portion of the Sb precursor reacts with at least a portion of the Ge and Te comprised therein to provide a third coating layer comprising Ge, Te, and Sb; and
  f) introducing a purge gas to remove any unreacted Sb precursor.

In certain embodiments, steps (a) through (f) are repeated a number of times until a desired thickness of coating layers is reached to provide the multicomponent film. In this or other embodiment, the steps may be performed in the order of:

e→f→→a→b→c→d.

In a further embodiment, there is provided a process of depositing a multicomponent film onto at least a portion of a substrate comprising the steps of:
  a. contacting the substrate with a Ge precursor comprising $HGeCl_3$ to react with the substrate and provide a first coating layer comprising Ge;
  b. introducing a purge gas to remove any unreacted Ge precursor;
  c. contacting the first coating layer comprising Ge with a Te precursor, wherein at least a portion of the Te precursor reacts with the Ge comprised therein to provide a second coating layer comprising Ge and Te; and
  d. introducing a purge gas to remove any unreacted Te precursor;
wherein steps (a) through (d) are repeated to form a number of coating layers and provide the film.

In a further embodiment, there is provided a process of depositing a germanium-containing film onto at least a portion of a substrate comprising the steps of: providing the substrate within a reactor; introducing into the reactor a Ge precursor comprising HGeCl₃ under deposition conditions sufficient to react with the substrate to provide a germanium-containing film. In this or other embodiments, the introducing further comprises an oxygen source or nitrogen source. In this or another embodiment, the germanium-containing film further comprises an oxygen source to provide a germanium oxide (GeO$_x$; x=1,2) film. Exemplary oxygen sources employed include, but are not limited to, oxygen (O₂), oxygen plasma, ozone (O₃), hydrogen peroxide, air, nitrous oxide, water plasma, and water. In a still further embodiment, the germanium-containing film further comprises a nitrogen source to provide a germanium nitride (GeN or Ge₃N₄) film. Exemplary nitrogen sources include but are not limited to ammonia, ammonia plasma, nitrogen/hydrogen plasma, and nitrogen plasma. In this or a still further embodiment, the germanium-containing film comprises a pure germanium film via introducing hydrogen plasma. In this or a still further embodiment, the germanium film further comprises nitridation using nitrogen plasma or ammonia plasma or nitrogen/hydrogen plasma to convert into a germanium nitride film.

In any of the preceding embodiments, it is understood that the steps of the methods described herein may be performed in a variety of orders, may be performed sequentially or concurrently (e.g., during at least a portion of another step), and any combination thereof. In certain embodiments, the steps described herein are performed sequentially to avoid formation of precipitates.

DETAILED DESCRIPTION OF THE INVENTION

To fabricate high density electronic devices such as phase change memory (PCRAM) or photovoltaic materials, Atomic Layer Deposition (ALD) is a preferred technology to deposit films, such as metal chalcogenide films, uniformly on small dimensional structures on a substrate surface. In certain embodiments, the film comprises a metal chalcogenide film. The term "metal chalcogenide" as used herein refers to a film that contains one or more Group 16 ion (chalcogenide) and at least one electropositive element. Examples of chalcogenide materials include, but are not limited to, sulfides, selenides, and tellurides. Conventional ALD technology involves ALD reactors which typically operate under vacuum and at elevated temperature. It also requires that the precursors be volatile and thermally stable compounds in order to be delivered to the reactor chamber in the vapor phase. ALD is a type of chemical vapor deposition that is used for highly controlled deposition of thin films. It is a self-limiting (e.g., the amount of film material deposited in each reaction cycle is constant) and sequential (e.g., the precursor vapors are brought onto the substrates alternately, one at a time, separated by purging periods with inert gas) process. ALD is considered a deposition method with the greatest potential for producing very thin, conformal films with control of the thickness and composition of the films possible at the atomic level. Using ALD, film thickness depends only on the number of reaction cycles, which makes the thickness control accurate and simple.

Described herein are methods and precursors for depositing germanium-containing films are multi-component films such as without limitation GeTe and GeTeSb films. Exemplary depositions temperatures for the method described here include ranges having any one or more of the following endpoints: 500, 400, 300, 200, 195, 190, 185, 180, 175, 170, 165, 160, 155, 150, 145, 140, 135, 130, 125, 120, 115, 110, 105, 100, 95, 90, 85, 80, 75, 70, 65, 60, 55, 50, 45, 40, 35, 30, 25, and/or 20° C. Examples of particular temperature ranges include, but are not limited to, from about 20 to about 200° C. or from about 50 to about 100° C.

In certain embodiments, the germanium-containing films further comprise tellurium and are deposited using a tellurium precursor. Exemplary tellurium precursors can be selected from disilyltellurium, silylalkyltellurium, silylaminotellurium with the general structures of:

where R¹, R², R³, R⁴, and R⁵ are independently selected from hydrogen, an alkyl group having 1-10 carbons in linear, branched, or cyclic forms without or with double bonds, or an C₃ to C₁₀ aryl groups.

In an ALD process, the tellurium precursors, alcohols, germanium and antimony precursors, such as (Me₂N)₄Ge and (Me₂N)₃Sb are introduced to a deposition chamber in any sequence in a cyclic manner by vapor draw or direct liquid injection (DLI). The deposition temperature is preferably between 25° to 500° C.

One embodiment of the method for depositing a multi-component film onto at least a portion of a substrate comprises the steps of:

a) contacting the substrate with a Ge precursor comprising HGeCl₃ to react with the substrate and provide a first coating layer comprising Ge;

b) introducing a purge gas to remove any unreacted Ge precursor;

c) contacting the first coating layer comprising Ge with a Te precursor wherein at least a portion of the Te precursor reacts with the Ge comprised therein to provide a second coating layer comprising Ge and Te;

d) introducing a purge gas to remove any unreacted Te precursor;

e) contacting the second coating layer comprising Ge and Te with a Sb precursor, wherein at least a portion of the Sb precursor reacts with at least a portion of the Ge and Te comprised therein to provide a third coating layer comprising Ge, Te, and Sb; and f) introducing a purge gas to remove any unreacted Sb precursor.

In certain embodiments, steps (a) through (f) are repeated a number of times until a desired thickness of coating layers is reached to provide the multicomponent film. In this or other embodiment, the steps may be performed in the order of:

e→f→→a→b→c→d.

Another embodiment of the method for depositing a multicomponent film onto at least a portion of a substrate comprises the steps:

a) Introducing HGeCl$_3$ to react with substrate to cover the substrate surface with Ge—Cl fragments b) Purging with inert gas c) Introducing a Te precursor to provide a Te layer and d) Purging with inert gas to remove any reaction by-products.

The ALD cycle is repeated a certain number of times until the desired film thickness is achieved. In the above embodiment, the next ALD cycle starts with Steps a) to d) and the steps are repeated continues until the desired thickness of film is obtained. In yet another embodiment of the method for depositing a multicomponent film onto at least a portion of a substrate comprises the steps:

a) introducing a Sb precursor to form a Sb layer comprising aminoantimony on the surface of the substrate b) purging with inert gas to remove any reaction by-products c) introducing a Te precursors to react with aminoantimony layer to form Sb—Te with a Te layer comprising silyl groups d) purging with inert gas to remove any reaction by-products e) introducing a Ge precursor comprising HGeCl$_3$ to react with remaining silyl groups on tellurium layer to form Te—Ge bonds with a Ge layer comprising Ge—Cl groups f) purging with inert gas g) introducing a Te precursors to react with aminoantimony layer to form Sb—Te with a Te layer comprising silyl groups and h) purging with inert gas to remove any reaction by-products.

The ALD cycle is repeated a certain number of times until the desired film thickness is achieved. In the above embodiment, the next ALD cycle starts with Step a through Step h which is then repeated continues until the desired thickness of film is obtained. In this or other embodiment, the steps may be performed in the order of:

e→f→g→h→a→b→c→d.

In certain embodiments, the order of Steps a to h can be alternated to achieve required GST film such as ratio of Ge vs Sb or Ge vs Te.

Exemplary silyltellurium compounds used in the process described herein have the following formulae:

(R$^1$R$^2$R$^3$Si)$_2$Te;

(R$^1$R$^2$R$^3$Si)TeR$^4$; and (R$^1$R$^2$R$^3$Si)TeN(R$^4$R$^5$)

where R$^1$, R$^2$, R$^3$, R$^4$ and R$^5$ are each individually a hydrogen atom, an alkyl groups with 1 to 10 carbons in a linear, branched, or cyclic form, or aromatic groups with 4 to 10 carbons.

Exemplary aminogermanes, aminoantimony, and antimony alkoxides in the process described herein have the following formulae:

(R$^1$R$^2$N)$_4$Ge (R$^1$R$^2$N)$_3$Sb (R$^1$O)$_3$Sb where R$^1$ and R$^2$ are each individually alkyl groups with 1 to 10 carbons in linear, branched, or cyclic form.

In the formulae above and throughout the description, the term "aryl" denotes an aromatic cyclic or an aromatic heterocyclic group having from 4 to 10 carbon atoms, from 4 to 10, from 5 to 10 carbon atoms, or from 6 to 10 carbon atoms. Exemplary aryl groups include, but are not limited to, pyrrolyl, phenyl, benzyl, chlorobenzyl, tolyl, and o-xylyl.

In one embodiment, the multicomponent film is deposited using an ALD method. The method described herein can be used to provide a thin film in a deposition apparatus. The deposition apparatus consists of the following parts.

A reactor where a substrate is placed, precursor vapors react and form films. The reactor walls and substrate holder can be heated at the same or different temperatures;

One or more liquid or solid precursor containers. The containers may also be heated if needed;

One or more valves that may switch on or off the vapor flows to the reactor from the precursor containers. A mass flow controller (MFC) unit is used to control when and how much valves 3 and 4 switch;

A vacuum pump that pumps out air or precursor vapors from the reactor. A valve switches on/off the pumping line;

A vacuum gauge that measures the pressure level within the reactor; and

An inert or purge gas (Ar or N$_2$) that switches on or off via a valve.

In a typical ALD process, the reactor is filled with inert gas (e.g., Ar or N$_2$) through an inlet and then pumped out using a vacuum pump 8 to a vacuum level below 20 mTorr. The reactor is then filled with inlet gas again and the reactor wall and substrate holder are heated to a temperature between 25° C. to 500° C. at which the deposition is set to begin. The Ge precursor is delivered from precursor container that is heated to a certain temperature range. The temperature remains constant during the deposition. The precursor is delivered from a precursor container that is heated to a temperature between 25° C. to 500° C. The temperature also remains a constant during the deposition. The number of the cycles is preset according to the film thickness that is predetermined. The GST films are formed by repeating the processes for Ge and Sb, respectively. The processes for the growth of Ge and Sb are similar to that for Te.

Existing ALD methods of making GST films from alkoxygermanes, alkoxyantimony, and silyltellurium generate GST films with composition of (GeTe$_2$)$_x$(Sb$_2$Te$_3$)$_y$, with a typical formula of Ge$_2$Sb$_2$Te$_7$ where germanium is tetravalent. Industry preferred GST material is Ge$_2$Sb$_2$Te$_5$ in the composition group of (GeTe)$_x$(Sb$_2$Te$_3$)$_y$, where germanium is divalent. In order to increase germanium content in the film to achieve Ge$_2$Sb$_2$Te$_5$, divalent germanium precursors have to be used. Most of divalent germanium compounds are either unstable or less volatile in a deposition process such as ALD. The method described herein provides, without being bound by theory, in-situ generation of divalent germanium which is used as intermediate to deposit divalent germanium on film surface. In certain embodiments, the trichlorogermane precursor is used to deposit germanium-containing films, such as without limitation, binary films GeTe as well as ternary films such as Ge$_2$Sb$_2$Te$_5$. Described herein is a method for depositing a multi-component film using trichlorogermane as precursor for ALD and CVD deposition of germanium containing thin films, such as GST films for PRAM applications. Trichlorogermane generates dichlorogermylene inside the deposition chamber. Dichlorogermylene reacts with disilyltellurium to form GeTe, which further combine with Sb$_2$Te$_3$ to form phase change material Ge$_2$Sb$_2$Te$_5$ for phase change memory allocations.

In one embodiment of the method described herein, the germanium precursor HGeCl$_3$ was used for GeTe film deposition having a 1:1 composition by an ALD deposition process. Using the tellurium precursor such as (SiMe$_3$)$_2$Te as a Te precursor, GeTe could be formed as following equations (1) and (2).

$$HGeCl_3 \rightarrow GeCl_2 + HCl \quad (1)$$

$$GeCl_2 + (SiMe_3)_2Te \rightarrow GeTe + 2Me_3SiCl \quad (2)$$

The byproduct or equation (2), Me$_3$SiCl is volatile, a pure GeTe film can be deposited.

In another embodiment of the method described herein, the germanium precursor HGeCl$_3$ was used for GeSe film deposition having 1:1 composition by an ALD deposition process. Using the silylselenium precursor such as (Me$_3$Si)$_2$Se as a Se precursor, GeSe could be formed as following equations (3) and (4).

$$HGeCl_3 \rightarrow GeCl_2 + HCl \quad (3)$$

$$GeCl_2 + (SiMe_3)_2Se \rightarrow GeSe + 2Me_3SiCl \quad (4)$$

The byproduct or equation (4), Me$_3$SiCl is volatile, a pure SeTe film can be deposited.

Examples of tellurium precursors or Te precursors may comprise disilyltellurium, silylalkyltellurium, or compounds having the general structures of: $(R^1R^2R^3Si)_2Te$ and $(R^1R^2R^3Si)R^4Te$. Examples of Selenium or Se precursors may comprise disilylselenium, silylalkylselenium, or compounds having the general structures of: $(R^1R^2R^3Si)_2Se$ or $(R^1R^2R^3Si)R^4Se$. In the foregoing formulas, substituents $R^1$, $R^2$, $R^3$, and $R^4$ are each independently: hydrogen; linear, branched, or unsaturated C$_{1-10}$ alkyl groups; and C$_{4-10}$ cyclic alkyl groups, or C$_{4-12}$ aromatic groups. The term "alkyl" as used herein is selected from the group consisting of: linear, branched, or unsaturated C$_{1-10}$ alkyl groups; and C$_{4-10}$ cyclic alkyl groups, preferably from 1 to 6 carbon atoms, more preferably from 1 to 3 carbon atoms, alternately from 3 to 5 carbon atoms, further alternately from 4 to 6 carbons atoms, or variations of the foregoing ranges. Exemplary alkyl groups include, but are not limited to, methyl (Me), ethyl (Et), n-propyl, isopropyl, n-butyl, isobutyl, sec-butyl, tert-butyl, tert-amyl, n-pentyl, n-hexyl, cyclopentyl, and cyclohexyl. The term "alkyl" applies also to alkyl moieties contained in other groups such as haloalkyl, alkylaryl, or arylalkyl. In certain embodiments, some of the groups discussed herein may be substituted with one or more other elements such as, for example, a halogen atom or other heteroatoms such as O, N, Si, or S.

Examples for the silyltellurium precursor include, but are not limited to, bis(trimethylsilyl)tellurium, bis(dimethylsilyl)tellurium, bis(triethylsilyl)tellurium, bis(diethylsilyl)tellurium, bis(phenyldimethylsilyl)tellurium, bis(t-butyldimethylsilyl)tellurium, dimethylsilylmethyltellurium, dimethylsilylphenyltellurium, dimethylsilyl-n-butyltellurium, dimethylsilyl-t-butyltellurium, trimethylsilylmethyltellurium, trimethylsilylphenyltellurium, trimethylsilyl-n-butyltellurium, and trimethylsilyl-t-butyltellurium.

Examples for the silylselenium precursor include, but are not limited to, bis(trimethylsilyl)selenium, bis(dimethylsilyl)selenium, bis(triethylsilyl)selenium, bis(diethylsilyl)selenium, bis(phenyldimethylsilyl)selenium, bis(t-butyldimethylsilyl)selenium, dimethylsilylmethylselenium.

The deposited films that can be made in accordance with the methods described herein are selected from the group selected from Germanium Tellurium (GT), Antimony Germanium (SG), Germanium Antimony Tellurium (GST), Germanium Oxide, and Germanium Nitride.

In one particular embodiment, the GST film is deposited using trichlorogermane. Trichlorogermane has an unique property. It is in equilibrium with germanium dichloride and HCl at room temperature (see equation (3)).

$$HGeCl_3 \leftrightarrows GeCl_2 + HCl \quad \text{Equation 3}$$

Germanium dichloride and HCl form loosely bonded complex. This complex can be distilled without decomposition (boiling point 75° C.) under atmospheric pressure. On the other hand, this complex can be pull apart by high vacuum at low temperature and generate pure germanium dichloride, which is a solid.

Described herein is a method for using trichlorogermane as germanium precursor for GST films. Trichlorogermane is delivered into ALD reactor chamber in vapor phase. The molecule is decomposed into germanium dichloride and HCl by low pressure to allow germanium dichloride to anchor on the substrate surface, and consequently reacts with disilyltellurium in ALD cycles to form GT films such as GeTe films, or GST films with disilyltellurium and antimony alkoxides such as antimony ethoxide or aminoantimony such as tris(dimethylamino)antimony as antimony (Sb) precursors.

$$GeCl_2 + (Me_3Si)_2Te \rightarrow GeTe + Me_3SiCl$$

$$Sb(OEt)_3 + (Me_3Si)_2Te \rightarrow Sb_2Te_3 + Me_3SiOEt$$

$$Sb(NMe_2)_3 + (Me_3Si)_2Te \rightarrow Sb_2Te_3 + Me_3SiNMe_2$$

$$GeTe + Sb_2Te_3 \rightarrow (GeTe)_x(Sb_2Te_3)_y$$

Germanium dichloride also reacts with trisilylantimony to form Ge$_3$Sb$_2$ films $$GeCl_2 + (Me_3Si)_3Sb \rightarrow Ge_3Sb_2 + Me_3SiCl$$

Examples for the aminoantimony include, but are not limited to, tris(dimethylamino)antimony, tris(diethylamino)antimony, tris(di-iso-propylamino)antimony, tris(di-n-propylamino)antimony, tris(di-sec-butylamino)antimony, and tris(di-tert-butylamino)antimony.

Examples for the antimony alkoxides include, but are not limited to, antimony ethoxide ((EtO)$_3$Sb), antimony methoxide ((MeO)$_3$Sb), antimony iso-propoxide (($^i$PrO)$_3$Sb), antimony n-propoxide (($^n$PrO)$_3$Sb), antimony sec-butoxide (($^s$BuO)$_3$Sb), antimony tert-butoxide (($^t$BuO)$_3$Sb).

Examples for the trisilylantimony precursors include, but are not limited to, tris(trimethylsilyl)antimony, tris(dimethylsilyl)antimony, tris(triethylsilyl)antimony, tris(diethylsilyl)antimony, tris(phenyldimethylsilyl)antimony, tris(t-butyldimethylsilyl)antimony.

The aforementioned examples are merely illustrative, and do not limit this disclosure in any way. While the method and precursor compositions have been described in detail and with reference to specific examples and the embodiments thereof, it will be apparent to one skilled in the art that various changes and modifications can be made therein without departing from the spirit and scope thereof.

EXAMPLES

Example 1

Deposition of GeTe Film

Deposition was performed in an ALD reactor manufactured by Quros reactor with a shower head type PEALD chamber with a load lock, which can handle one 4 inch wafer. The phase transition properties of samples and films were characterized by Energy Dispersive X-ray Analysis.

A GeTe film was obtained with in the following manner. The $HGeCl_3$ canister temperature was around 1° C., and $(Me_3Si)_2Te$ canister temperature was at 40° C. A typical wafer temperature is 70° C., typical Ar gas flow rate is 500 sccm, and the reactor pressure is controlled at 3 Torr. The film was deposited in the following manner after a wafer was loaded on a heated susceptor in the reactor and Ar gas was flowing into the reactor for a few minutes.
a) Ge precursor pulse step; $HGeCl_3$ vapor is introduced into the reactor for typically 0.1 sec using a vapor draw method. The vapor draw method used herein means that the vapor of a precursor comes from a canister without any help of a carrier gas, and so only outlet valve of the canister opens at a pulse step.
b) Ar (Ge) purge step; Ar gas flows into the reactor for seconds to remove any unreacted Ge species and reaction byproducts.
c) Te precursor pulse step; $(Me_3Si)_2Te$ vapor is introduced into the reactor for a few seconds by Ar carrier gas (50 sccm) flowing through the Te canister.
d) Ar (Te) purge step; Ar gas flows into the reactor for seconds to remove any unreacted Te species, and reaction byproducts.

Steps a) to d) were repeated 100 times to obtain a required film thickness.

Figure 1:
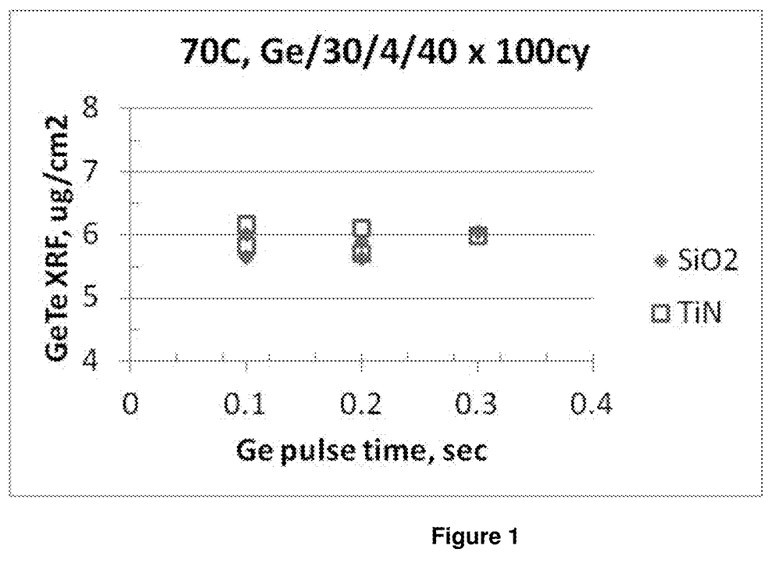
FIG. 1 provides the GeTe XRF compared to Ge pulse time (seconds) for those films deposited on the SiO₂ and TiN substrates in Example 1.

Using the above procedure, both silicon oxide and titanium nitride as substrate, trichlorogermane as Ge precursor, and bis(trimethylsilyl)tellurium as Te precursor, GeTe films were deposited in the sequence in each cycle were tested: (1) various seconds of Ge pulse; (2) 30 seconds Ar purge; (3) 4 seconds Te pulse; and (4) 40 seconds Ar purge. XRF indicated the Ge/Te atomic ratio is 1:1. FIG. 1 provides the GeTe XRF compared to Ge pulse time (seconds) for those films deposited on the $SiO_2$ and TiN substrates. Same result can be obtained when the Te precursor pulse step can be applied first instead of Ge precursor pulse step.

Example 2

ALD Satuation Curve: Te Precursor Pulse Time vs. GeTe Deposition Rate

Figure 2:
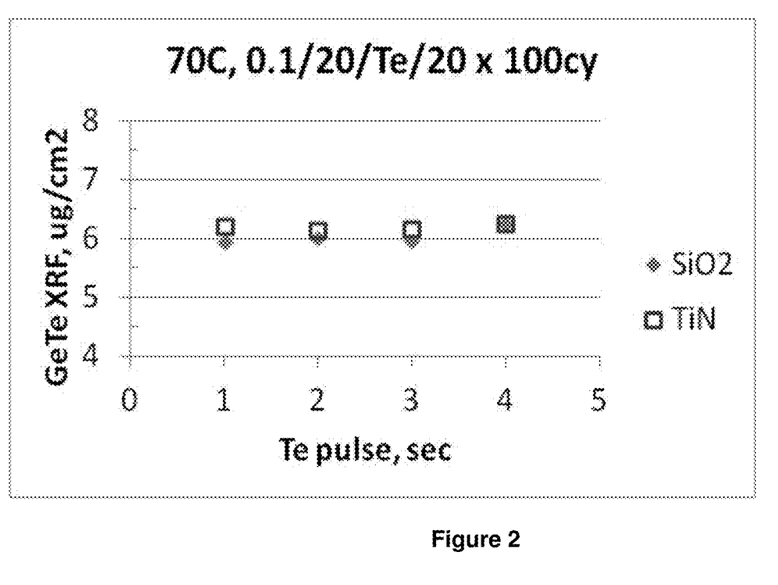
FIG. 2 provides the GeTe XRF compared to Ge pulse time (seconds) for those films deposited on the SiO₂ and TiN substrates in Example 2.

Using a procedure similar to that described in Example 1 and silicon oxide and titanium nitride as substrates, trichlorogermane as Ge precursor, and bis(trimethylsilyl)tellurium as Te precursor, GeTe films were deposited via ALD. 100 ALD cycles with the following sequence in each cycle were tested: (1) 0.1 second Ge pulse; (2) 20 seconds Ar purge; (3) various seconds of Te pulse; and (4) 20 seconds Ar purge. XRF indicated the Ge/Te atomic ration of 1:1. FIG. 2 provides the GeTe XRF compared to Te pulse time (seconds) for those films deposited on the $SiO_2$ and TiN substrates.

Example 3

ALD Satuation Curve: Ge Precursor Pulse Time vs. GeSb Deposition Rate

Figure 3:
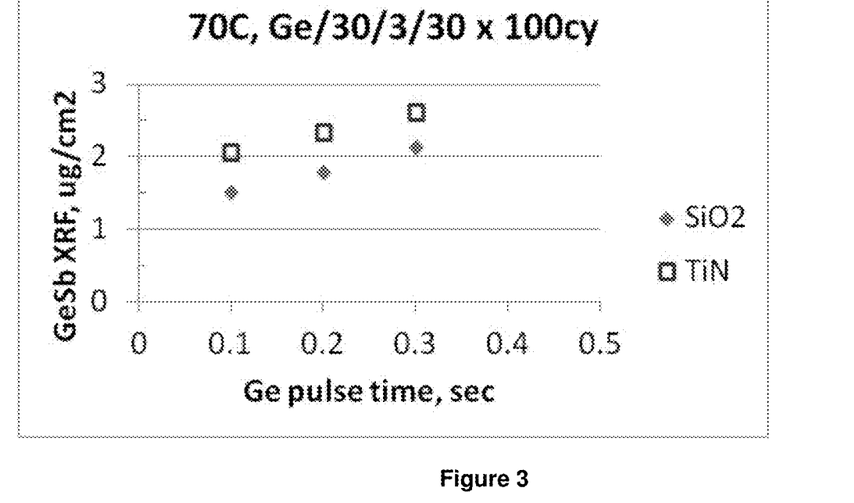
FIG. 3 provides the GeTe XRF compared to Ge pulse time (seconds) for those films deposited on the SiO₂ and TiN substrates in Example 3.

Using a procedure similar to that described in Example 1 and silicon oxide and titanium nitride as substrates, trichlorogermane as Ge precursor, and tris(trimethylsilyl)antimony as Sb precursor rather than a Te precursor, GS films were deposited via ALD. 100 ALD cycles with the following sequence in each cycle were tested: (1) various seconds of Ge precursor pulse; (2) 30 seconds Ar purge; (3) 3 seconds Sb precursor pulse; and (4) 30 seconds Ar purge. XRF indicated the Ge/Sb atomic ratio of 1:1. FIG. 3 provides the GeSb XRF compared to Sb precursor pulse time (seconds) for those films deposited on the $SiO_2$ and TiN substrates.

Example 4

ALD Satuation Curve: Sb Precursor Pulse Time vs. GeSb Deposition Rate

Figure 4:
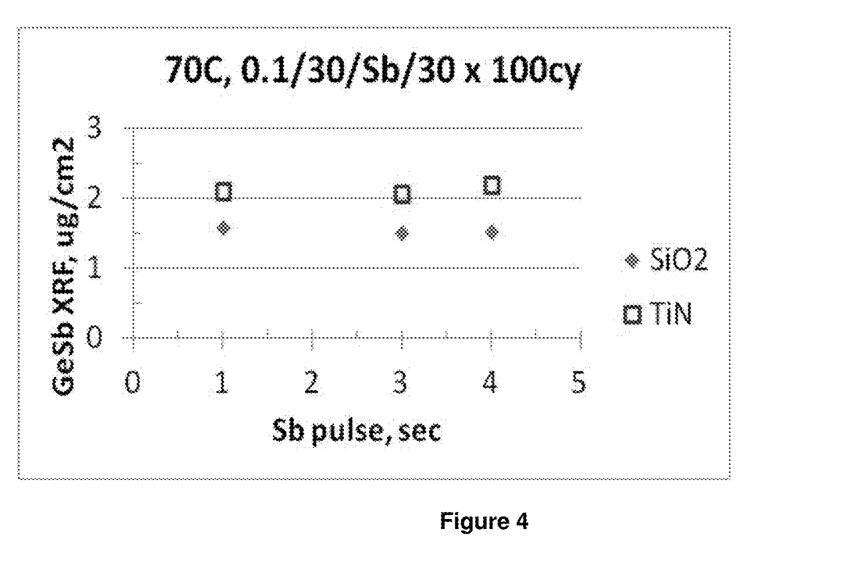
FIG. 4 provides the GeTe XRF compared to Ge pulse time (seconds) for those films deposited on the SiO₂ and TiN substrates in Example 4.

Using a procedure similar to that described in Example 1 and silicon oxide and titanium nitride as substrates, trichlorogermane as Ge precursor, and tris(trimethylsilyl)antimony as Sb precursor rather than a Te precursor, GeSb films were deposited via ALD. 100 ALD cycles with the following sequence in each cycle were tested: (1) 0.1 second Ge precursor pulse; (2) 20 seconds Ar purge; (3) various seconds of Sb precursor pulse; and (4) 20 seconds Ar purge. XRF indicated the Ge/Sb atomic ratio of 1:1. FIG. 4 provides the GeSb XRF compared to Sb pulse time (seconds) for those films deposited on the $SiO_2$ and TiN substrates.

Example 5

GeTe Deposition Rate vs. Substrate Temperature

Figure 5:
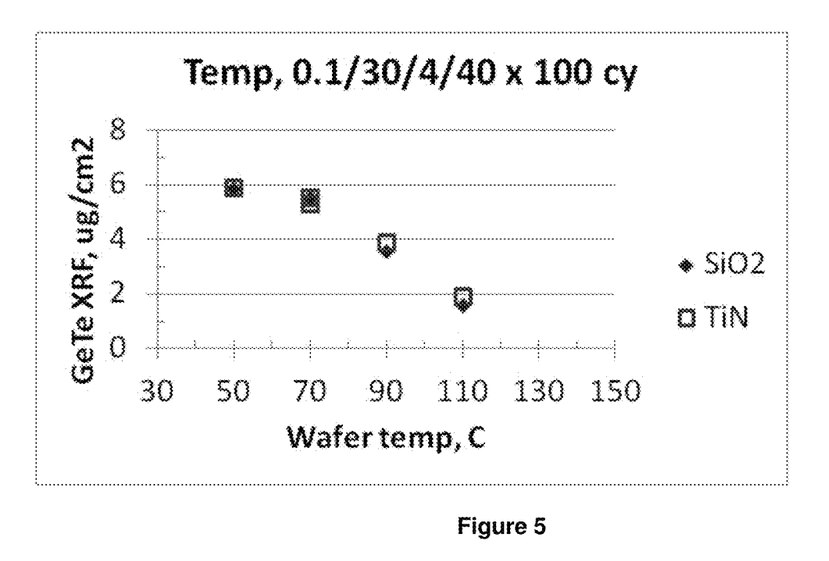
FIG. 5 provides the GeTe XRF compared to Ge pulse time (seconds) for those films deposited on the SiO₂ and TiN substrates in Example 5.

Using above procedure, both silicon oxide and titanium nitride as substrate, trichlorogermane as Ge precursor, and bis(trimethylsilyl)tellurium as Te precursor. 100 ALD cycles with the following sequence in each cycle were tested: (1) 0.1 second Ge precursor pulse; (2) 30 seconds Ar purge; (3) 4 seconds Te precursor pulse; and (4) 40 seconds Ar purge. The resulting data show that the GeTe deposition rates decreased as the temperatures increased in the temperature range of 50 to 110° C. FIG. 5 provides the GeTe XRF compared to substrate temperature (degrees celsius) for those films deposited on the $SiO_2$ and TiN substrates.

The above examples show that GeTe films exhibited 1:1 compositions under the ALD deposition conditions described above. Saturation conditions with these precursors, and GeTe deposition rate at 70° C. was 1.16 A/cycle. Deposition rate decreased gradually with increase of substrate temperatures. XPS results showed very low Cl and C impurities in the GeTe film.

Example 6

Deposition for GeSbTe Ternary Film

Ge—Sb—Te ternary films were deposited in a showerhead-type ALD reactor with a 6-inch-wafer scale (CN-1, Atomic-premium) at temperatures ranging from 50° C. to 120° C. using $HGeCl_3$ as the Ge precursor, $Sb(OEt)_3$ as the Sb precursor, and $Te(SiMe_3)_2$ as the Te precursor. The $HGeCl_3$ canister temperature was around 1° C., $Sb(OEt)_3$ canister temperature was at 40° C., and $Te(SiMe_3)_2$ canister temperature was at 40° C. The film composition was determined by XRF.

Figure 6A:
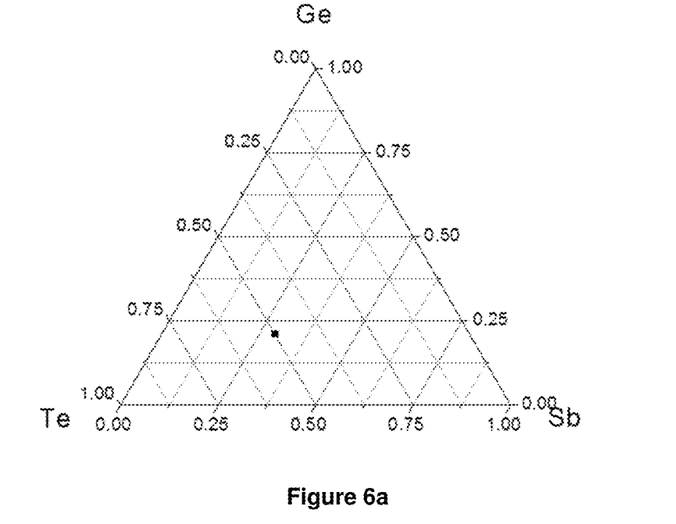
FIG. 6a provides the GeSbTe XRF using 50 ALD cycles consist of 1 GeTe sequence and 1 SbTe sequence on a silicon oxide substrate in Example 6.
Figure 6B:
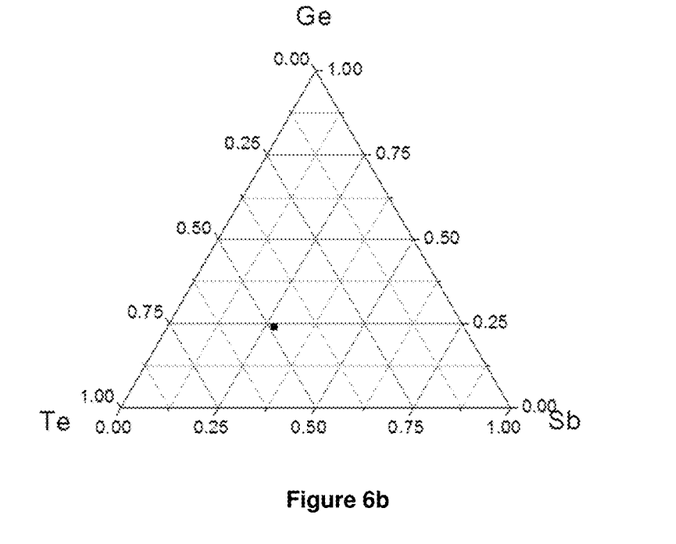
FIG. 6b provides the GeSbTe XRF using 50 ALD cycles consist of 1 GeTe sequence and 1 SbTe sequence on a titanium nitride substrate in Example 6.

Using a procedure similar to that described in Example 1, except that the antimony precursor is introduced first, and silicon oxide and titanium nitride as substrates, bis(trimethylsilyl)tellurium as Te precursor and antimony ethoxide as Sb precursor rather than a Ge precursor, SbTe films were deposited via ALD. Combining SbTe deposition procedure and GeTe deposition procedure (from Example 1) can deposit GeSbTe films by repeating a) to d) steps in procedure using Sb/Te or Ge/Te precursors (called GeTe sequence and SbTe sequence, respectively). FIGS. 6a and 6b provides the GeSbTe XRF using 50 ALD cycles consisting of 1 GeTe sequence and 1 SbTe sequence on silicon oxide and titanium nitride substrates, respectively. The total layer density was 4.31 ug $cm^{-2}$ on the $SiO_2$ substrate and 4.84 ug $cm^{-2}$ on the TiN substrate. The number of each sequence in one ALD cycle can be modified to change the composition of films.

Example 7

GeSbTe ternary film growth vs cycle

Figure 7A:
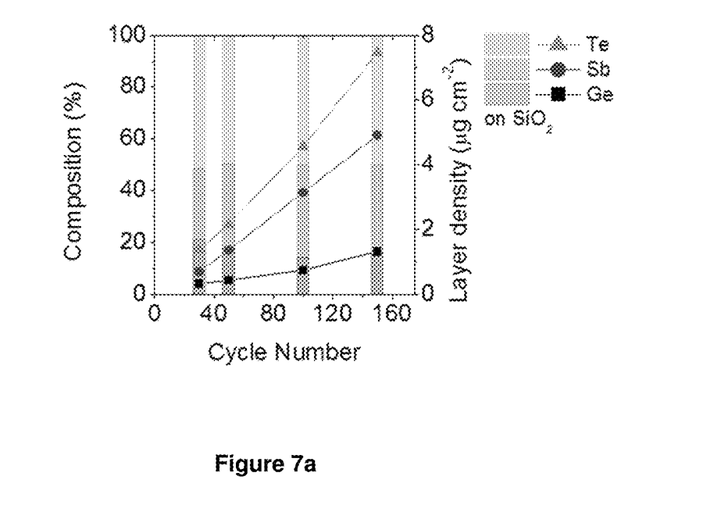
FIG. 7a provides the GeSbTe XRF compared to cycle number for those films deposited on the silicon oxide substrate in Example 7.
Figure 7B:
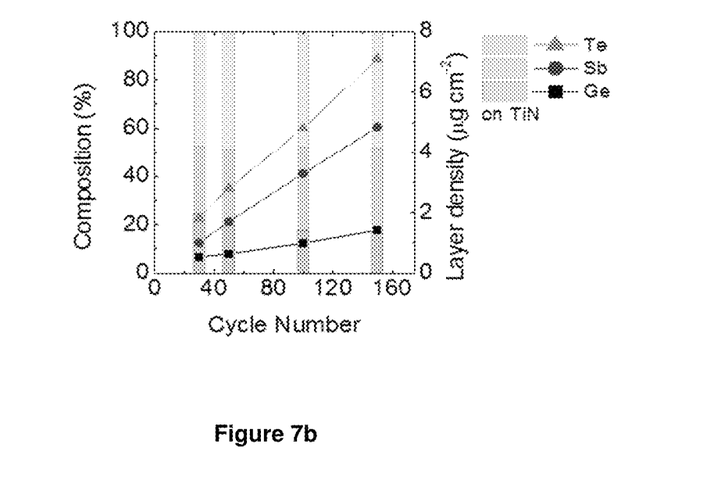
FIG. 7b provides the GeSbTe XRF compared to cycle number for those films deposited on a titanium nitride substrate in Example 7.

Using a procedure similar to that described in Example 6 and silicon oxide and titanium nitride as substrates, trichlorogermane as Ge precursor, antimony ethoxide as Sb precursor and bis(trimethylsilyl)tellurium as Te precursor, GeSbTe ternary film were deposited. Various number of cycles was tested with the following sequence in each cycle: (a) 3 seconds of Sb precursor pulse; (b) 15 seconds Ar purge; (c) 1 second of Te precursor pulse; (d) 15 seconds of Ar purge; (e) 5 seconds of Ge precursor pulse; (f) 15 seconds of Ar purge; (g) 1 second of Te precursor pulse; and (h) 15 seconds of Ar purge. FIGS. 7a and 7b provides the GeSbTe XRF compared to cycle number for those films deposited on the silicon oxide and titanium nitride substrates, respectively. By the procedure, Ge:Sb:Te ratio of 15:35:50 film was deposited.

The invention claimed is:

1. A method for depositing a germanium-containing film onto at least a portion of a substrate, the method comprising steps of:
    a. providing the substrate into a reactor; and
    b. introducing into the reactor a germanium precursor comprising $HGeCl_3$ under deposition conditions sufficient for the germanium precursor to react with the substrate and provide the germanium-containing film.
2. The method of claim 1 further comprising introducing a nitrogen source into the reactor wherein the nitrogen source reacts to provide a germanium-containing film.
3. The method of claim 2 wherein the nitrogen source is at least one selected from the group consisting of ammonia, ammonia plasma, a plasma comprising nitrogen and hydrogen, nitrogen plasma, and combinations thereof.
4. The method of claim 3 wherein the nitrogen source is ammonia.

* * * * *